(12) United States Patent
Yamanaka et al.

(10) Patent No.: US 7,120,177 B2
(45) Date of Patent: Oct. 10, 2006

(54) LASER ELEMENT, METHOD OF PRODUCING THE LASER ELEMENT, AND A LASER MODULE EMPLOYING THE LASER ELEMENT

(75) Inventors: Fusao Yamanaka, Kaisei-machi (JP); Teruhiko Kuramachi, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 243 days.

(21) Appl. No.: 10/766,808

(22) Filed: Jan. 30, 2004

(65) Prior Publication Data

US 2004/0184493 A1 Sep. 23, 2004

(30) Foreign Application Priority Data

Jan. 31, 2003 (JP) ............................. 2003-024001

(51) Int. Cl.
*H01S 3/04* (2006.01)
(52) U.S. Cl. ............................. 372/34; 372/36
(58) Field of Classification Search ................. 372/34, 372/36, 50.12
See application file for complete search history.

(56) References Cited

U.S. PATENT DOCUMENTS 4,360,965 A * 11/1982 Fujiwara ...................... 438/26

2002/0090172 A1* 7/2002 Okazaki et al. ............... 385/27

OTHER PUBLICATIONS

Roland Diehl (Ed.), "High-Power Diode Lasers: Fundamentals, Technology, Applications, With Contributions by Numerous Experts", 2000, pp. preface and 303-367, Springer, Verlag Berlin Heidlelberg, Germany.

* cited by examiner

*Primary Examiner*—Minsun Oh Harvey
*Assistant Examiner*—Dung T. Nguyen
(74) *Attorney, Agent, or Firm*—Sughrue Mion, PLLC

(57) ABSTRACT

In a method for producing a laser element, a brazing material is placed between a nitride-based semiconductor laser bar and a fixation surface of a heat sink, where the brazing material contains gold and one of tin and silicon as main components, the nitride-based semiconductor laser bar has at least three light-emission points formed on a substrate, the heat sink is made of copper or copper alloy, and the fixation surface has a predetermined shape. Then, the nitride-based semiconductor laser bar is fixed to the fixation surface of the heat sink by melting and solidifying the brazing material while pressing the nitride-based semiconductor laser bar toward the heat sink with a tool having a shape corresponding to the predetermined shape of the fixation surface.

6 Claims, 10 Drawing Sheets

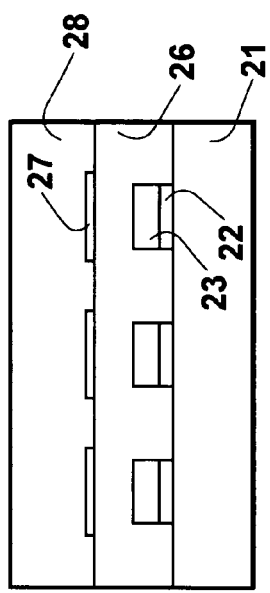
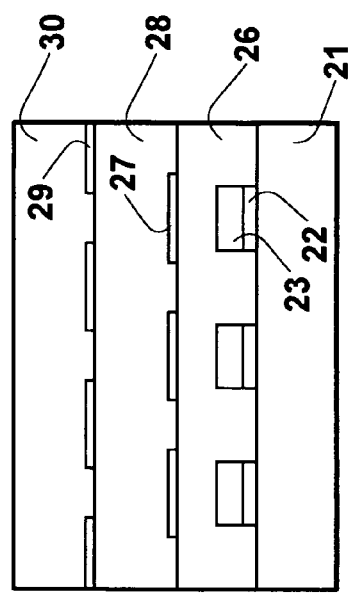
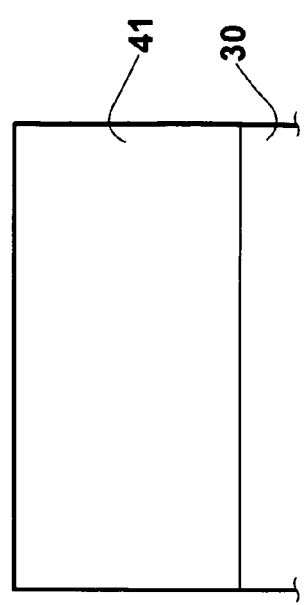
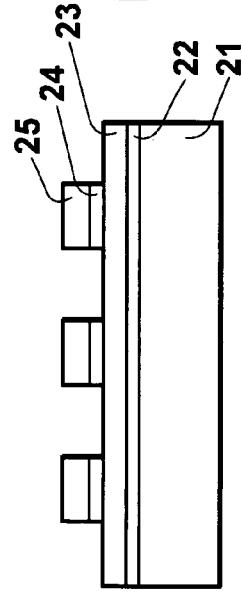
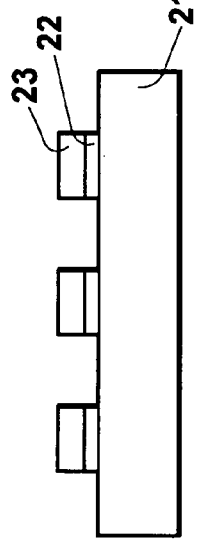
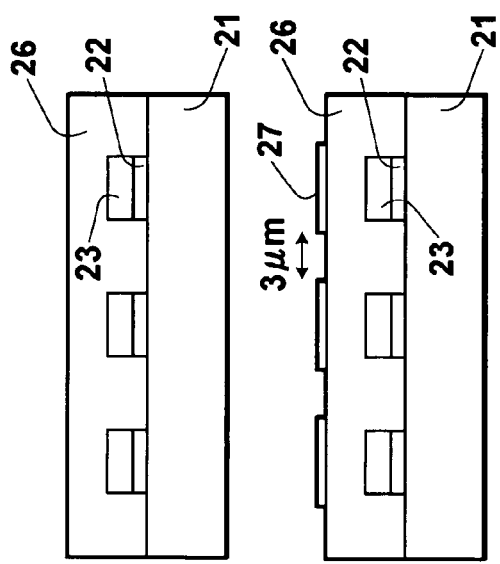
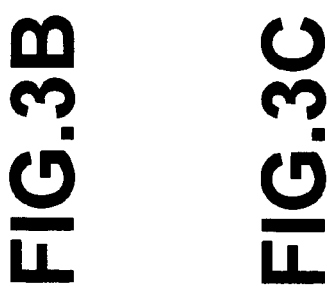

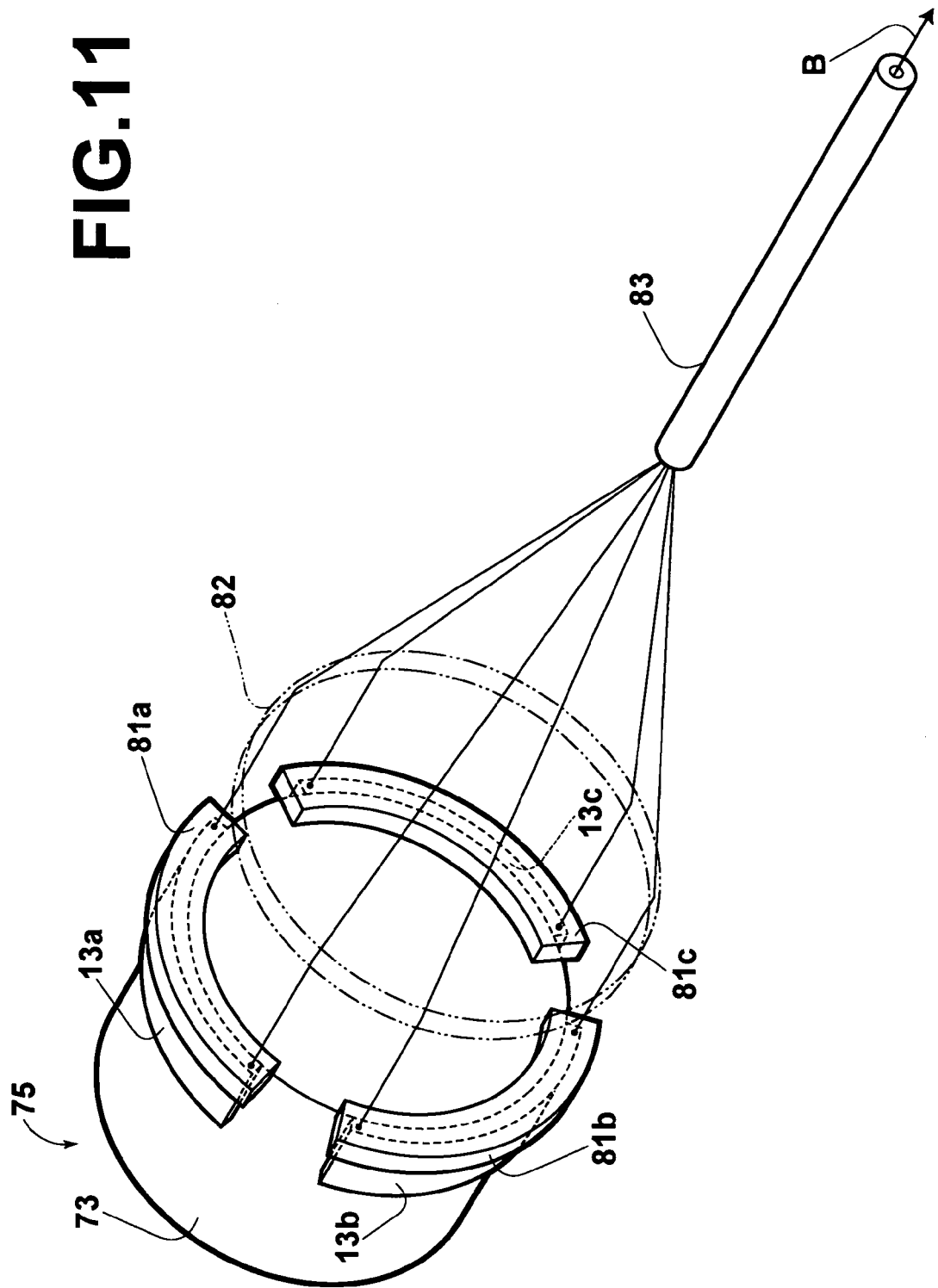

LASER ELEMENT, METHOD OF PRODUCING THE LASER ELEMENT, AND A LASER MODULE EMPLOYING THE LASER ELEMENT

BACKGROUND OF THE INVENTION

1. Field of the Invention

The present invention relates to a laser element in which a laser bar being made of nitride-based semiconductor materials and containing a plurality of light-emission points formed on a single substrate is fixed to a heat sink. The present invention also relates to a process for producing the above laser element. The present invention further relates to a laser module containing the above laser element.

2. Description of the Related Art

The following documents (1) and (2) disclose information related to the present invention.

(1) U.S. patent Laid-Open No. 20020090172

(2) Roland Dichel (ed.), "High-Power Diode Lasers: Fundamentals, Technology, Applications, With Contributions by Numerous Experts," Springer-Verlag, 2000

In order to increase laser output power, laser modules which comprise at least one laser-light source for emitting a plurality of laser beams, an optical fiber, and an optical system have been proposed, for example, as disclosed in document (1). The optical system comprises a plurality of collimator lenses and a condensing lens for optically multiplexing the plurality of laser beams emitted from the at least one laser-light source. The at least one laser-light source can be realized by arranging on a heat sink a plurality of laser diodes each having a single light-emission point, or using a semiconductor laser bar in which semiconductor layers are formed on a single substrate so as to realize a plurality of light-emission points.

However, in semiconductor laser bars in each of which a plurality of light-emission points are formed by crystal growth on a single substrate, a so-called "smile", which is a curvature of the array of the plurality of light-emission points, is produced, and a portion of a plurality of laser beams are displaced upward or downward from positions at which the portion of the plurality of laser beams should be arranged, as explained in, for example, the aforementioned document (1). Conventionally, each of the above semiconductor laser bar is bonded onto a heat sink having a flat fixation surface while correcting the curvature by pressing a columnar collet to the center or its vicinity of the semiconductor laser bar in the direction in which the plurality of light-emission points are arrayed.

For example, in the case where the magnification power of an optical system in a laser module as mentioned before is about 10, and the light-emission-point displacement (defined later) in a semiconductor laser bar is about 2 micrometers, the light convergence point is displaced by a maximum of about 20 micrometers (=2 micrometers×10) at a light-entrance end of an optical fiber. That is, the light convergence spot is displaced by a maximum of about 20 micrometers from the center of an optical fiber. In the case of the typical optical fiber having a radius of 25 micrometers, the above displacement causes significant decrease in the coupling efficiency. The light-emission-point displacement is defined as the difference between the maximum and the minimum of distances from a fixation surface of a heat sink to the centers of light-emission points in a place perpendicular to the optical axis of lenses.

On the other hand, conventionally, indium, which has low rigidity (i.e., is soft), is used for bonding laser bars made of GaAs-based semiconductor materials to heat sinks made of copper. Since the thermal expansion coefficients of the copper heat sinks and the laser bars made of GaAs-based semiconductor materials are greatly different, heat generated by operation of the semiconductor laser bar causes internal strains in the semiconductor laser bars. However, when indium is used for the bonding, the internal strains can be relieved.

The nitride-based semiconductor laser bars which are formed by growing GaN-based compound semiconductors on a sapphire or GaN substrate so as to realize a plurality of light-emission points generally have higher rigidity than the GaAs-based compound semiconductor laser bars. Therefore, it is impossible to deform each nitride-based semiconductor laser bar so as to have a shape equivalent to the surface of a heat sink, even when an attempt is made to bond the nitride-based semiconductor laser bar to the heat sink by pressing, with a collet as mentioned before, only the center or its vicinity of the semiconductor laser bar in the direction in which the plurality of light-emission points are arrayed. In addition, when indium is used as a soft brazing material, it is impossible to fix the nitride-based semiconductor laser bar to the heat sink so that the nitride-based semiconductor laser bar has a shape equivalent to the surface shape of a heat sink, because the hardness of the nitride-based semiconductor laser bar is high.

Further, in the case where nitride-based semiconductor laser bars are used in laser modules as mentioned before, the aforementioned curvature decreases the coupling efficiency to the optical fiber. Furthermore, each nitride-based semiconductor laser bar tends to revert toward a shape having the original curvature. Therefore, due to heat generation during operation and other reasons, the coupling efficiency decreases as time elapses.

SUMMARY OF THE INVENTION

The present invention has been developed in view of the above circumstances.

A first object of the present invention is to provide a laser element in which a semiconductor laser bar is fixed to a heat sink so that the semiconductor laser bar has a shape which substantially matches with a shape of a surface onto which the semiconductor laser bar is to be fixed.

A second object of the present invention is to provide a process for producing the above laser element.

A third object of the present invention is to provide a laser module which uses the above laser element, and realizes great coupling efficiency to an optical fiber.

In order to accomplish the first object, the first aspect of the present invention is provided. According to the first aspect of the present invention, there is provided a laser element comprising: a heat sink which is made of copper or copper alloy, and has a fixation surface having a predetermined shape; and a nitride-based semiconductor laser bar which has at least three light-emission points formed on a substrate, and is bonded to the heat sink with a brazing material containing gold and one of tin and silicon as main components, by pressing the nitride-based semiconductor laser bar toward the fixation surface with a tool having a shape corresponding to the predetermined shape of the fixation surface during a brazing operation.

The nitride-based semiconductor laser bar is pressed toward the fixation surface of the heat sink by using a tool having a shape corresponding to the predetermined shape of the fixation surface of the heat sink during the operation for fixing the nitride-based semiconductor laser bar to the heat sink. Therefore, it is possible to align the light-emission points in the nitride-based semiconductor laser bar along the shape of the fixation surface of the heat sink.

In addition, the brazing material used for the bonding contains gold and one of tin and silicon as main components. Therefore, it is possible to firmly bond the nitride-based semiconductor laser bar to the heat sink, reduce the amounts of movement of the light-emission points with elapse of time, and increase reliability of the laser element.

In order to accomplish the second object, the second aspect of the present invention is provided. According to the second aspect of the present invention, there is provided a method for producing a laser element, comprising the steps of: (a) placing a brazing material between a nitride-based semiconductor laser bar and a fixation surface of a heat sink, where the brazing material contains gold and one of tin and silicon as main components, the nitride-based semiconductor laser bar has at least three light-emission points formed on a substrate, the heat sink is made of copper or copper alloy, and the fixation surface has a predetermined shape; and (b) fixing the nitride-based semiconductor laser bar to the fixation surface by melting and solidifying the brazing material while pressing the nitride-based semiconductor laser bar toward the heat sink with a tool having a shape corresponding to the predetermined shape of the fixation surface.

According to the above method, the nitride-based semiconductor laser bar is pressed toward the fixation surface of the heat sink by using a tool having a shape corresponding to the predetermined shape of the fixation surface during the operation for fixing the nitride-based semiconductor laser bar to the heat sink. Therefore, it is possible to align the light-emission points along the shape of the fixation surface of the heat sink.

In addition, the brazing material used for the bonding contains gold and one of tin and silicon as main components. Therefore, it is possible to absorb the difference in the thermal expansion coefficient between the copper heat sink and the nitride-based semiconductor laser bar, and reduce internal strains generated in the nitride-based semiconductor laser bar.

Further, the hardness of the brazing material containing gold and one of tin and silicon as main components is higher than the hardness of the brazing material containing indium as a main component. Therefore, it is possible to firmly fix the nitride-based semiconductor laser bar, which has high rigidity. Furthermore, since reversion toward the original curved shape with elapse of time can be prevented by the hard brazing material, it is possible to achieve high reliability over time.

In order to accomplish the third object, the third aspect of the present invention is provided. According to the third aspect of the present invention, there is provided a laser module comprising an optical fiber, the laser element according to the first aspect of the present invention, and an optical condensing system. The optical condensing system optically multiplexes the laser beams, and makes the optically multiplexed laser beams enter the optical fiber.

When the laser element according to the first aspect of the present invention is used in a laser module in which laser beams are optically multiplexed in an optical fiber, it is sufficient to align the optical axes of lenses corresponding to the light-emission points along the surface shape of the heat sink, since the light-emission points are aligned along the surface shape of the heat sink. Thus, according to the fourth aspect of the present invention, designing and alignment of the optical system and manufacture of the laser module are facilitated.

In addition, since the laser module according to the third aspect of the present invention uses the laser element which exhibits high reliability over time as mentioned before, it is possible to increase the coupling efficiency to the optical fiber through the optical system.

BRIEF DESCRIPTION OF THE DRAWINGS

FIGS. 3A to 3G are cross-sectional views of respective stages of a process for producing a GaN substrate in a nitride-based semiconductor laser bar which constitutes a laser element according to the present invention.

FIG. 11 is a perspective view of a laser module according to the fourth embodiment.

DESCRIPTION OF THE PREFERRED EMBODIMENTS

Embodiments of the present invention are explained in detail below with reference to the drawings.

First Embodiment

Figure 1A:
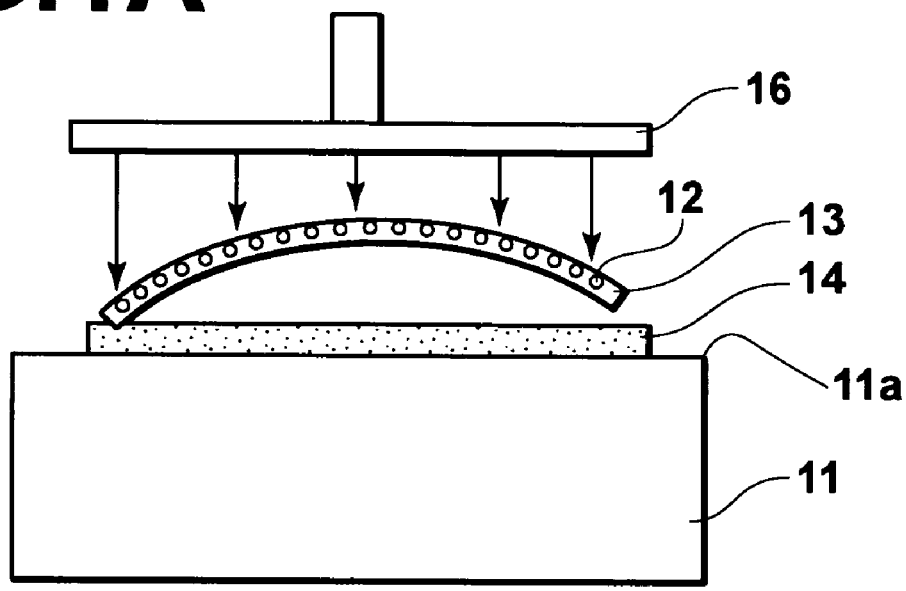
FIGS. 1A and 1B are cross-sectional views of initial and final stages of a process for producing a laser element according to a first embodiment of the present invention.
Figure 1B:
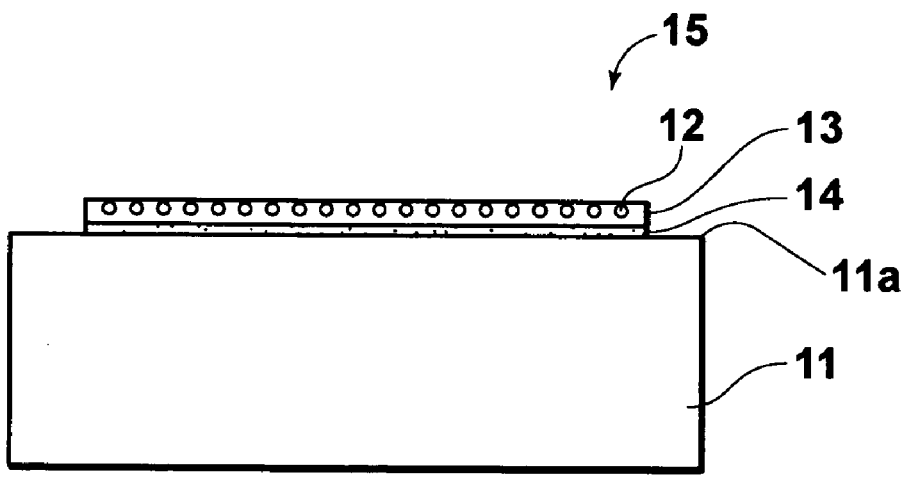

A process for producing a laser element according to the first embodiment of the present invention is explained below. FIGS. 1A and 1B are cross-sectional views of initial and final stages of the process for producing the laser element according to the first embodiment.

As illustrated in FIG. 1A, an AuSn brazing material 14 in pellet form having a thickness of about 3 to 50 micrometers is placed on a flat surface 11a of a heat sink 11, which is made of copper and plated in such a manner that the outermost layer of the plating is gold and has a thickness of about 1 micrometer. Then, a nitride-based semiconductor laser bar 13 is fixed to the heat sink 11 by placing the nitride-based semiconductor laser bar 13 on the brazing material 14, and heating, melting, and then solidifying the brazing material 14 while pressing the nitride-based semiconductor laser bar 13 toward the heat sink 11 with a bonding collet 16, which is constituted by a flat plate corresponding to the shape of the surface 11a of the heat sink. At this time, it is assumed that the surface 11a of the heat sink has a flatness of 0.02 micrometers or less per 10 mm.

In the laser element produced as above, the curvature of the nitride-based semiconductor laser bar 13 is corrected so that light-emission points 12 in the nitride-based semiconductor laser bar 13 are aligned along a straight line approximately in correspondence with the shape of the surface 11a of the heat sink, as illustrated in FIG. 1B. In this example, the aforementioned light-emission-point displacement is 0.2 micrometers.

Alternatively, the brazing material 14 may be deposited on the heat sink 11 by evaporation, instead of the placement of the brazing pellet.

The heat sink 11 has a thickness of about 6 mm, and is realized by a copper block on which a nickel layer having a thickness of 0.1 micrometers and a platinum layer having a thickness of about 0.2 micrometers are formed in this order.

The bonding collet 16 need not be a flat plate, and may have a plurality of convex portions. In the latter case, it is preferable that the tops of the convex portions have a shape corresponding to the fixation surface of the heat sink.

Figure 2:
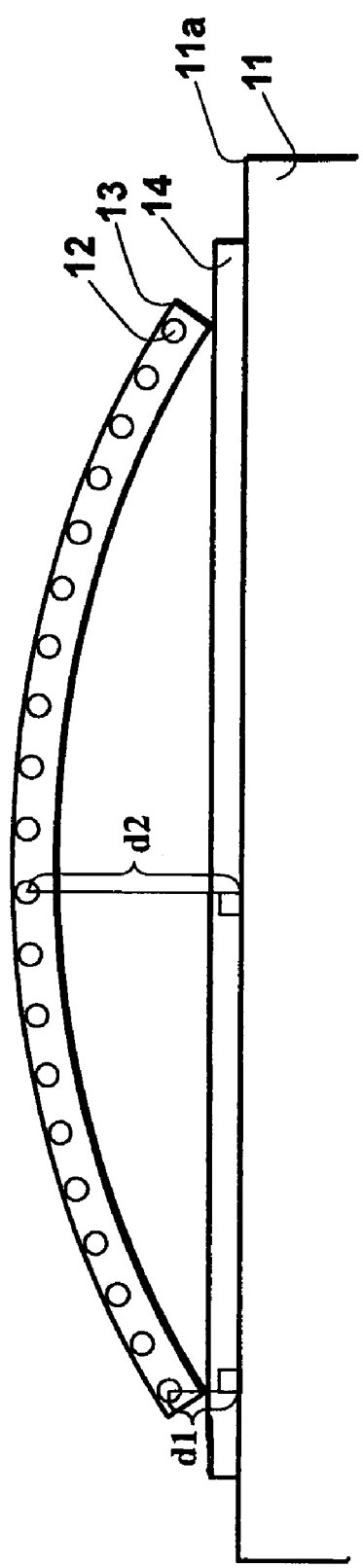
FIG. 2 is a diagram indicating a definition of the light-emission-point displacement in the case where the fixation surface of a heat sink is flat.

As mentioned before and illustrated in FIG. 2, the light-emission-point displacement is defined as a difference ($d_2 - d_1$) between the maximum $d_2$ and the minimum $d_1$ of the distances from the fixation surface of the heat sink to the centers of the light-emission points 12 in a place perpendicular to the optical axis of lenses.

Figure 4:
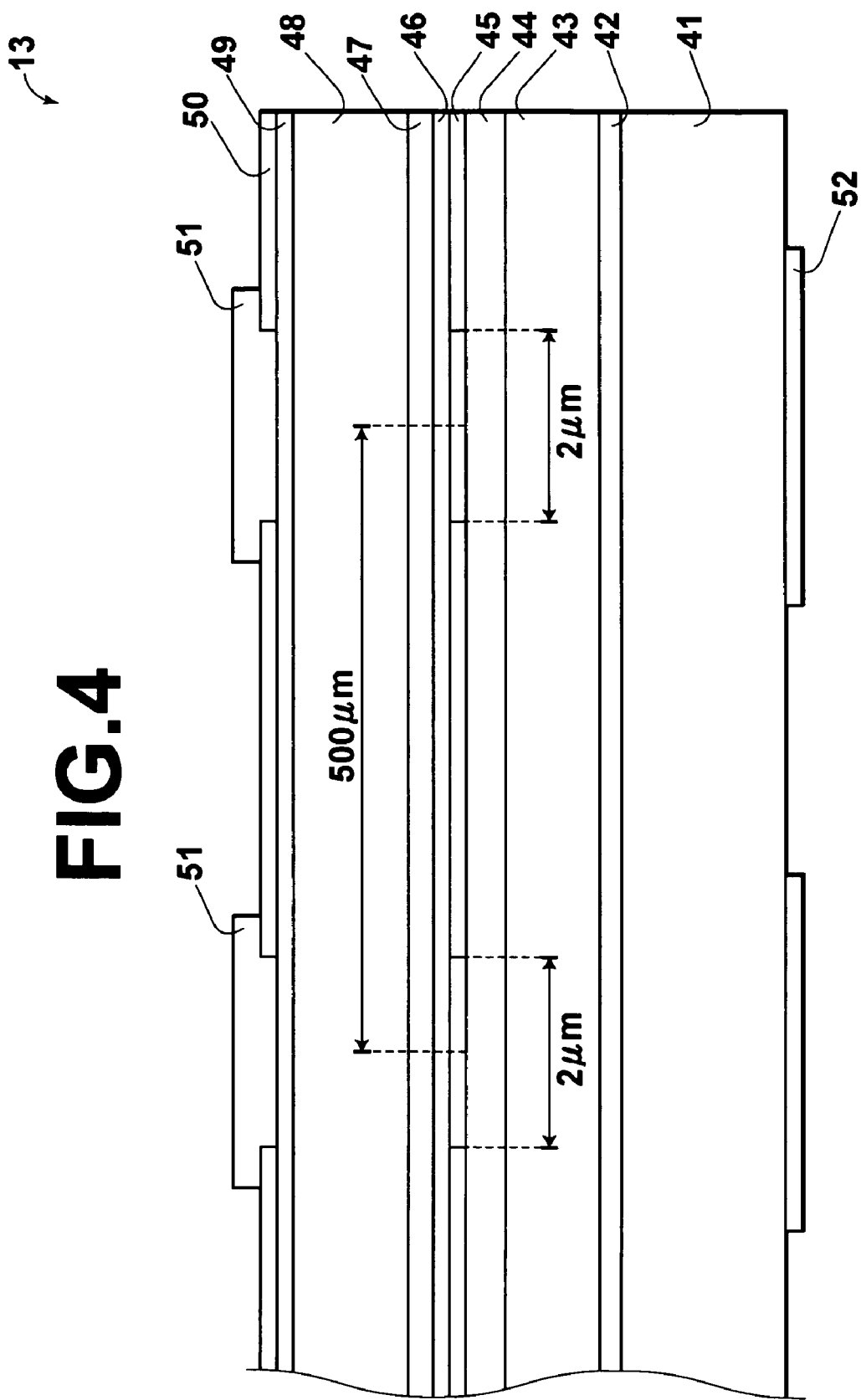
FIG. 4 is a cross-sectional view of a nitride-based semiconductor laser bar which constitutes a laser element according to the present invention.

Hereinbelow, a process for producing the nitride-based semiconductor laser bar is explained below. FIGS. 3A to 3G are cross-sectional views of respective stages of a process for producing a GaN substrate used in the nitride-based semiconductor laser bar, and FIG. 4 is a cross-sectional view of the nitride-based semiconductor laser bar, which is provided for explaining steps of forming semiconductor layers on the GaN substrate.

First, the process for producing the GaN substrate used in the nitride-based semiconductor laser bar is explained below with reference to FIGS. 3A to 3G.

As illustrated in FIG. 3A, a GaN buffer layer 22 having a thickness of about 20 nm is formed on a (0001) C face of a sapphire substrate 21 at 500° C., and subsequently a GaN layer 23 having a thickness of about 2 micrometers is formed at 1,050° C., by organometallic vapor phase epitaxy, where trimethyl gallium (TMG) and ammonia are used as materials for growth of GaN, silane gas is used as n-type dopant gas, and cycropentadienyl magnesium ($Cp_2Mg$) is used as a p-type dopant. Thereafter, a $SiO_2$ film 24 is formed on the GaN layer 23, and a resist 25 is applied to the $SiO_2$ film 24. Then, a line-space pattern of $SiO_2$ having a period of about 10 micrometers is formed by removing stripe areas of the $SiO_2$ film 24 each having a width of about 3 micrometers and extending in the <1$\bar{1}$00> direction by conventional lithography so as to leave stripe areas of the $SiO_2$ film 24 each having a width of about 7 micrometers.

Next, as illustrated in FIG. 3B, stripe regions of the GaN layer 23 and the GaN buffer layer 22 which are not covered by the above line-space pattern of $SiO_2$ are removed so as to expose the upper surface of the sapphire substrate 21 by dry etching using the remaining areas of the resist 25 and the $SiO_2$ film 24 as a mask and chlorine gas as an etchant. At this time, the sapphire substrate 21 may be slightly etched. Then, the remaining areas of the resist 25 and the $SiO_2$ film 24 are removed.

Thereafter, as illustrated in FIG. 3C, a GaN layer 26 having a thickness of about 20 micrometers is formed by selective growth. At this time, GaN laterally grown from the stripe regions of the GaN layer 23 and the GaN buffer layer 22 finally coalesces, and the upper surface of the GaN layer 26 becomes flattened. No threading dislocation occurs in first portions of the GaN layer 26 located between the stripe regions of the GaN layer 23 and the GaN buffer layer 22, while threading dislocations can occur in second portions of the GaN layer 26 located above the stripe regions of the GaN layer 23 and the GaN buffer layer 22.

Subsequently, as illustrated in FIG. 3D, a $SiO_2$ film 27 is formed on the GaN layer 26, and then first stripe areas of the $SiO_2$ film 27 being located above the central regions of the above first portions of the GaN layer 26 and each having a width of about 3 micrometers are removed so as to leave second stripe areas of the $SiO_2$ film 27.

Next, as illustrated in FIG. 3E, a GaN layer 28 having a thickness of about 20 micrometers is formed by selective growth at a growth temperature of 1,050° C. At this time, GaN laterally grown from the stripe areas of the GaN layer 26 exposed by the above removal of the first stripe areas of the $SiO_2$ film 27 finally coalesces, and the upper surface of the GaN layer 28 becomes flattened.

Thereafter, as illustrated in FIG. 3F, a $SiO_2$ film 29 is formed on the GaN layer 28, and then first stripe areas of the $SiO_2$ film 29 being located above the central areas of the second stripe areas of the $SiO_2$ film 27 and each having a width of about 3 micrometers are removed so as to leave second stripe areas of the $SiO_2$ film 29. Then, a GaN layer 30 having a thickness of about 20 micrometers is formed by selective growth at a growth temperature of 1,050° C. over the second stripe areas of the $SiO_2$ film 29 and the stripe areas of the GaN layer 28 exposed by the above removal of the first stripe areas of the $SiO_2$ film 29.

Finally, as illustrated in FIG. 3G, an n-type GaN layer 41 having a thickness of about 100 to 200 micrometers is grown on the above structure illustrated in FIG. 3F, and the layers except for the n-type GaN layer 41 are removed, i.e., only the n-type GaN layer 41 is left. Thus, the n-type GaN layer 41 can be used as an n-type GaN substrate in the nitride-based semiconductor laser bar.

Next, a process for producing the nitride-based semiconductor laser bar is explained below with reference to FIG. 4.

As illustrated in FIG. 4, an n-type GaN buffer layer 42, a superlattice lower cladding layer 43, an n-type GaN optical waveguide layer 44, a triple-quantum-well active layer 45, an p-type $Al_{0.2}Ga_{0.8}N$ carrier block layer 46, a p-type GaN optical waveguide layer 47, a superlattice upper cladding layer 48, and a p-type GaN contact layer 49 are formed on the n-type GaN layer 41 produced as explained with reference to FIGS. 3A to 3G, where the superlattice lower cladding layer 43 is comprised of 150 pairs of n-type $Al_{0.14}Ga_{0.86}N$ and GaN sublayers each having a thickness of 2.5 nm, the triple-quantum-well active layer 45 is formed with n-type $In_{0.02}Ga_{0.98}N$ sublayers each having a thickness of 10.5 nm and n-type $In_{0.02}Ga_{0.85}N$ sublayers each having a thickness of 3.5 nm, and the superlattice upper cladding layer 48 is comprised of 150 pairs of p-type $Al_{0.14}Ga_{0.86}N$ and GaN sublayers each having a thickness of 2.5 nm. At this time, magnesium is used as a p-type impurity. In order to activate magnesium as the p-type impurity, it is possible to heat-treat the above structure in a nitrogen atmosphere after the formation of the above layers, or grow the above layers in a nitrogen-rich atmosphere.

Subsequently, a SiO$_2$ insulation film 50 having stripe openings being arranged with a pitch of 500 micrometers and each having a width of 2 micrometers is formed on the p-type GaN contact layer 49 so as to expose stripe areas of the p-type GaN contact layer 49. Then, a Ni/Au p-electrode 51 is formed over the exposed stripe areas of the p-type GaN contact layer 49. Next, the bottom surface of the sapphire substrate is polished, and a Ti/Au n-electrode 52 is formed on areas of the polished surface corresponding to the areas of the upper surface in which the Ni/Au p-electrode 51 is formed. Thereafter, opposite end surfaces of a resonator are formed by cleaving the above layered structure, and a high-reflection coating and a low-reflection coating are provided on the opposite end surfaces of the resonator, respectively. Then, the construction of FIG. 4 is cleaved into a bar having a bar length of about 1 cm and a resonator length of 400 micrometers. Thus, the nitride-based semiconductor laser bar 13 is obtained.

The oscillation wavelength of the nitride-based semiconductor laser bar 13 produced as above ranges from 400 to 420 nm, and the output power is 30 mW. In the nitride-based semiconductor laser bar 13, twenty light-emission points 12 each having a width of about 2 micrometers are arranged with a pitch of about 500 micrometers over the length of about 1 cm. In addition, the nitride-based semiconductor laser bar 13 is convexedly curved on the p-electrode side. The light-emission-point displacement in the nitride-based semiconductor laser bar 13 before fixation to the heat sink 11 is about 10 micrometers.

After the laser element is produced as illustrated in FIGS. 1A and 1B, a cyclic heat treatment is performed on the laser element. In the cyclic heat treatment, the temperature is cyclically raised and lowered one thousand times between −20° C. and 80° C. The cyclic heat treatment is a necessary process for relaxing stresses generated in the brazing material when the brazing material is melted and solidified to bond the nitride-based semiconductor laser bar 13 to the heat sink 11, and is indispensable for ensuring reliability of the laser element.

The above laser element according to the first embodiment of the present invention and a conventional laser element (prepared for comparison) are compared with respect to the light-emission-point displacement after each of the bonding to the heat sink and the cyclic heat treatment, where the nitride-based semiconductor laser bar used in the conventional laser element is produced in a similar manner to the nitride-based semiconductor laser bar 13 in the laser element according to the first embodiment so that the nitride-based semiconductor laser bar used in the conventional laser element has twenty light-emission points 12 which are arranged over the length of about 1 cm, and the light-emission-point displacement in the nitride-based semiconductor laser bar in the conventional laser element before fixation to a heat sink is also about 10 micrometers.

In addition, in the conventional laser element, the nitride-based semiconductor laser bar is bonded to the heat sink in a similar manner to the laser element according to the first embodiment except that the shape of the collet and the brazing material is different from those of the present invention.

Figure 5:
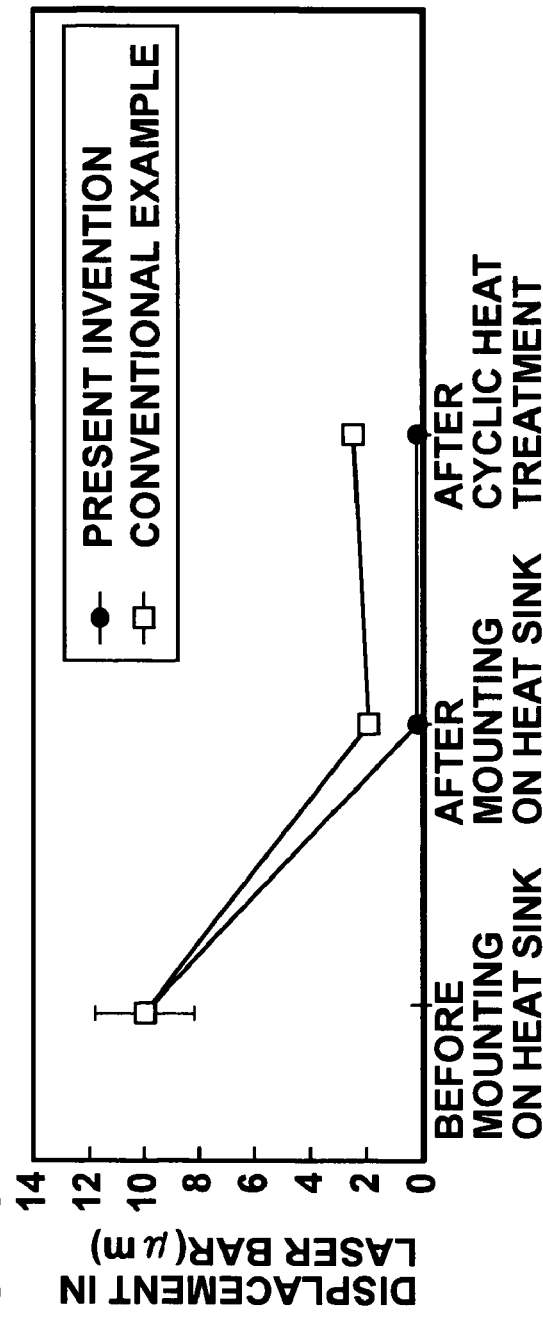
FIGS. 5A and 5B are a graph and a table each indicating amounts of the light-emission-point displacements in a laser element according to the present invention and a conventional laser element for comparison, after each of mounting on a heat sink and cyclic heat treatment.

FIGS. 5A and 5B are a graph and a table each indicating the light-emission-point displacement in each of the laser element according to the first embodiment of the present invention and the above conventional laser element prepared for comparison, after each of the bonding to the heat sink and the cyclic heat treatment.

As indicated in FIGS. 5A and 5B, after the mounting on the heat sink, the light-emission-point displacement in the laser element produced by the method according to the present invention is 0.2 micrometers while the light-emission-point displacement in the conventional laser element produced by the conventional production method is 2 micrometers. It is considered that the light-emission-point displacement in the laser element produced by the method according to the present invention is small because the collet 16 used for pressing the nitride-based semiconductor laser bar 13 in the method according to the first embodiment of the present invention has a flat surface which is similar to the shape of the surface 11a of the heat sink, and the brazing material 14 used in the method according to the first embodiment of the present invention is AuSn, which exhibits high hardness.

In addition, the light-emission-point displacement after the cyclic heat treatment is 0.2 micrometers in the laser element produced by the method according to the first embodiment of the present invention, and 2.5 micrometers in the conventional laser element produced by the conventional production method. It is considered that the warpage occurs in the laser bar in the conventional laser element because the brazing material used in the laser element produced by the conventional production method is In, which exhibits lower hardness than AuSn.

Further, the heat sink in the laser element according to the first aspect of the present invention may be made of a copper alloy, e.g., CuTe.

Second Embodiment

Figure 6:
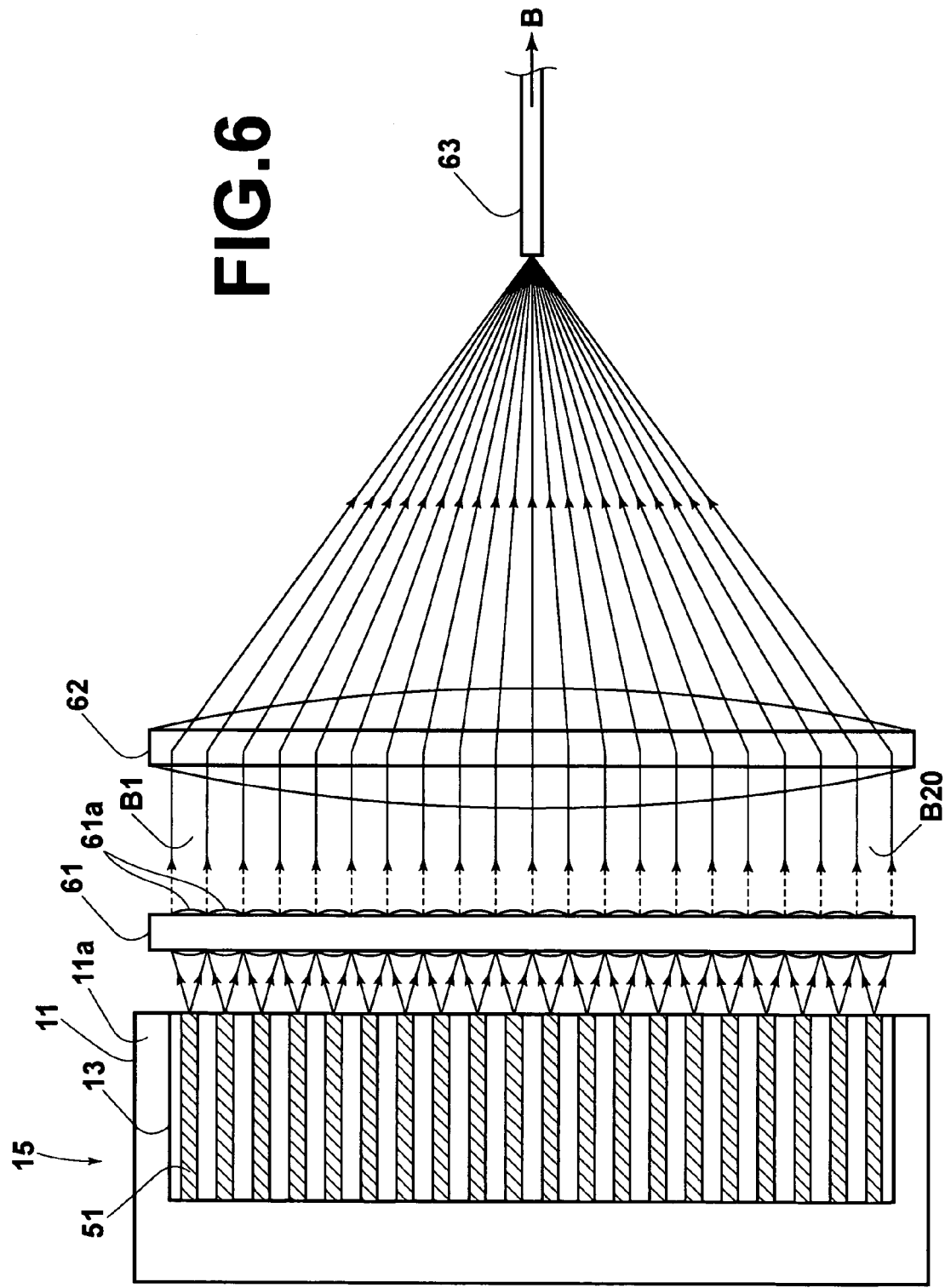
FIG. 6 is a plan view illustrating an outline of a construction of the laser module according to a second embodiment of the present invention.

A laser module according to the second embodiment of the present invention, which uses the laser element according to the first embodiment of the present invention is explained below. FIG. 6 is a plan view illustrating an outline of the construction of the laser module according to the second embodiment of the present invention.

As illustrated in FIG. 6, the laser module according to the second embodiment comprises a laser element 15, an optical system, and a single multimode optical fiber 63. In the laser element 15, a nitride-based semiconductor laser bar 13 having twenty light-emission points and a length of 1 cm is fixed to a heat sink 11 made of copper with an AuSn brazing material, where the light-emission-point displacement is 0.2 micrometers. The optical system is constituted by a collimator-lens array 61 and a condensing lens 62.

Although the nitride-based semiconductor laser bar 13 emits twenty laser beams B1 through B20, in order to simplify the illustration, only the references B1 and B20 are indicated in FIG. 6.

The laser beams B1 through B20, which are emitted from the light-emission points in the nitride-based semiconductor laser bar 13, are divergent laser beams, and collimated by the collimator-lens array 61.

The collimated laser beams B1 through B20 are collected by the condensing lens 62, and converge on an entrance-end face of the core of the multimode optical fiber 63. In this example, the collimator-lens array 61 and the condensing lens 62 constitute an optical condensing system, and the optical condensing system and the multimode optical fiber 63 constitute an optical multiplex system. Thus, the laser beams B1 through B20 collimated and collected as above enter and propagate through the core of the multimode optical fiber 63, and are optically multiplexed into a single laser beam B, which is then outputted from the multimode optical fiber 63.

In the collimator-lens array 61, twenty collimator lenses 61a are linearly aligned and integrally formed. Each of the collimator lenses 61a has an elongated shape corresponding to a portion of an axially symmetric lens which contains the optical axis of the axially symmetric lens. Specifically, each of the collimator lenses 61a has aperture diameters of 0.5 and 1.5 mm in the horizontal and vertical directions, respectively. In addition, each of the collimator lenses 61a has a focal length $f_1$ of 1.2 mm, a numerical aperture (NA) of 0.6, and an effective height of 2.5 mm. Further, the aspect ratio of each of the collimator lenses 61a is determined in correspondence with the shape of the cross section of each of the laser beams B1 through B20, for example, to be 3:1. The twenty collimator lenses 61a are arranged with a pitch of 500 micrometers corresponding to the pitch of the light-emission points in the nitride-based semiconductor laser bar 13, where the precision in the pitch is 0.2 micrometers or less.

The laser beams B1 through B20 respectively enter the collimator lenses 61a in such a manner that the direction in which the spread angle of each of the laser beams B1 through B20 is maximized coincides with the direction of the greater diameter of the elongated aperture of each of the collimator lenses 61a, and the direction in which the spread angle of each of the laser beams B1 through B20 is minimized coincides with the direction of the smaller diameter of the elongated aperture of each of the collimator lenses 61a. The beam diameters of each of the incident laser beams B1 through B20 in the horizontal and vertical directions are respectively 0.36 mm and 1.04 mm. Since the elliptic cross sections of the incident laser beams B1 through B20 fit well with the elongated shapes of the collimator lenses 61a, it is possible to minimize portions of the apertures of the collimator lenses 61a which are not effectively used. In other words, the collimator lenses 61a can be efficiently used.

The condensing lens 62 is a truncated lens having a width of 12 mm, an effective height of 10 mm, a focal length of 16.0 mm, and a numerical aperture (NA) of 0.6. The twenty the laser beams B1 through B20 are collected by the condensing lens 20, and converge on the end face of the core of the multimode optical fiber 63 with a convergence spot diameter of about 26 micrometers.

The multimode optical fiber 63 is formed by using a graded-index type optical fiber manufactured by Mitsubishi Cable Industries, Ltd as its base. The multimode optical fiber 63 has a graded-index type core and a step-index type cladding, where the core diameter is 50 micrometers, the numerical aperture (NA) is 0.3, and the transmittance of the end face coating is 99.5% or greater. In this example, the core diameter multiplied by the NA is 7.5 micrometers.

It is preferable that the elements constituting the above laser module are contained in a package having a box shape and an opening on the upper side, and the opening is closed with a package cover. In this case, it is possible to prevent adhesion of contaminants to surfaces of the elements located in the optical path, and obtain a laser module having high reliability over time. In particular, in the wavelength range of 350 to 450 nm, the containment in the package is effective since the high optical energy promotes collection of dust.

In the laser module according to the second embodiment, the coupling efficiency of the laser beams B1 through B20 to the multimode optical fiber 63 is 90%. Therefore, when the output power from each of the light-emission points in the nitride-based semiconductor laser bar 13 is 30 mW, it is possible to obtain an optical multiplexed laser beam B with the output power of 540 mW (=30 mW×0.9×20).

Figure 7:
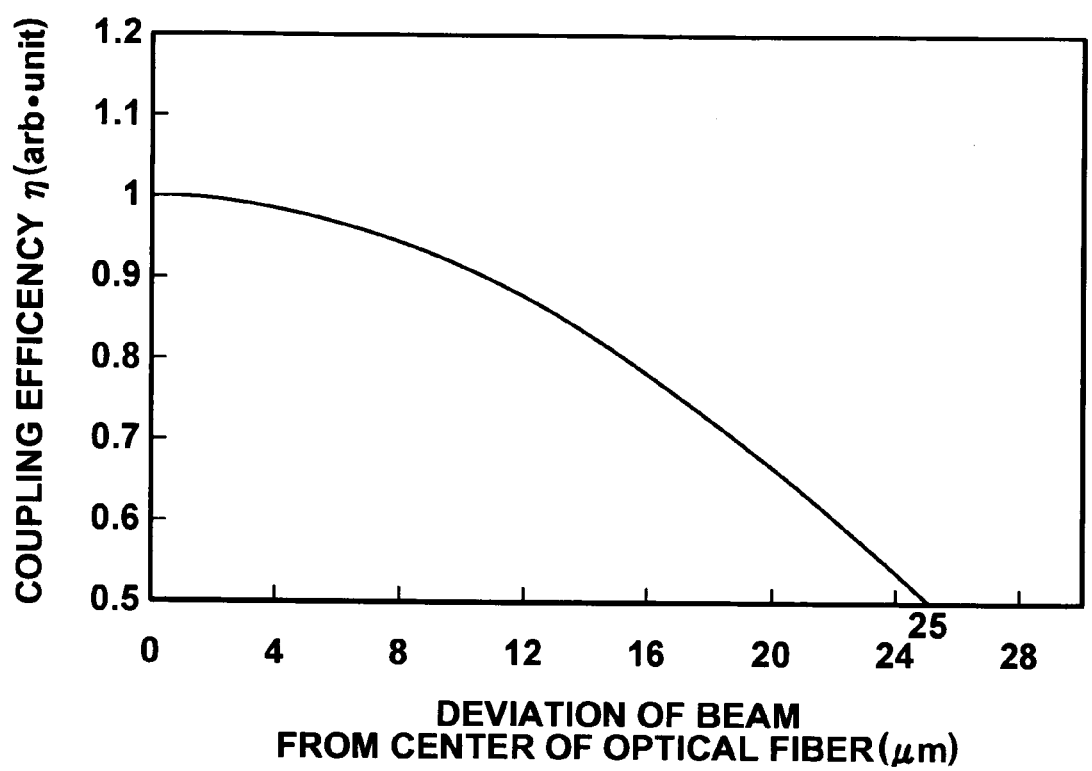
FIG. 7 is a graph indicating a relationship between the coupling efficiency of a laser beam to an optical fiber and the amount of deviation of the laser beam from the center of the optical fiber.

Hereinbelow, variations in the coupling efficiency of a single laser beam to the multimode optical fiber in the above laser module in the case where the laser beam deviates from the center of the multimode optical fiber are considered. FIG. 7 is a graph indicating a relationship between the coupling efficiency of a laser beam to an optical fiber and the amount of deviation of the laser beam from the center of the optical fiber, where the radius of the optical fiber is 25 micrometers.

The magnification power of the optical system in the laser module according to the second embodiment is determined, based on the focal lengths of the collimator lenses and the condensing lens, to be 13.3≈16 mm/1.2 mm. That is, for example, when the light-emission-point displacement in the nitride-based semiconductor laser bar, which is convexed, is 1 micrometer, and the laser beam emitted from the light-emission point located at the center of the laser element is aligned with the center of the optical fiber, the laser beams emitted from the light-emission points which are most displaced deviate by 13.3 micrometers from the center of the optical fiber. When the laser beams deviate by 13.3 micrometers, the coupling efficiency decreases by about 15% as illustrated in FIG. 7.

In a laser module using the aforementioned conventional laser element prepared for comparison, the light-emission-point displacement in the conventional laser element after the cyclic heat treatment is 2.5 micrometers. Therefore, for example, when the laser beam emitted from the light-emission point located at the center of the conventional laser element is aligned with the center of the optical fiber (i.e., when the laser beam emitted from the light-emission point located at the center of the conventional laser element is aligned with the optical axis of the corresponding collimator lens), the laser beams emitted from the light-emission points nearest to both ends of the nitride-based semiconductor laser bar deviate by 33 micrometers (=2.5 micrometers×13.3) from the center of the optical fiber. When the laser beams deviate by about 33 micrometers, it is impossible to couple the laser beams to an optical fiber having a radius of 25 micrometers.

On the other hand, in the laser module using the laser element according to the first embodiment of the present invention, the light-emission-point displacement in the laser element after the cyclic heat treatment is 0.2 micrometers. Therefore, when the laser beam emitted from the light-emission point located at the center of the laser element according to the first embodiment is aligned in a similar manner to the above conventional laser element, the laser beams emitted from the light-emission points nearest to both ends of the nitride-based semiconductor laser bar deviate by 2.6 micrometers (=0.2 micrometers×13.3) from the center of the optical fiber. When the laser beams deviate by about 2.6 micrometers, it is possible to maintain high coupling efficiency by keeping the reduction in the coupling efficiency 5% or less.

Third Embodiment

Figure 8A:
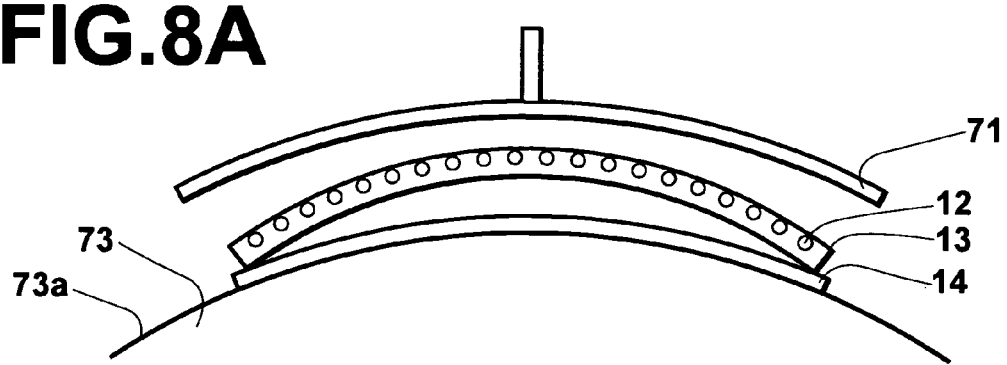
FIGS. 8A and 8B are cross-sectional views of initial and final stages of a process for producing a laser element according to a third embodiment of the present invention.
Figure 8B:
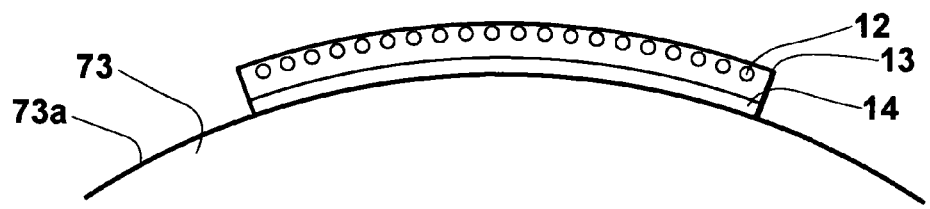

A process for producing a laser element according to the third embodiment of the present invention is explained below. FIGS. 8A and 8B are cross-sectional views of initial and final stages of the process for producing the laser element according to the third embodiment. In FIGS. 8A and 8B, elements which are equivalent to corresponding elements in FIGS. 1A and 1B bear the same references as the corresponding elements in FIGS. 1A and 1B.

As illustrated in FIG. 8A, an AuSn brazing material 14 having a thickness of about 3 to 50 micrometers is deposited by evaporation on a cylindrical surface 73a of a heat sink 73, which is made of copper and coated by evaporation with nickel, platinum, and gold films respectively having thicknesses of 0.1, 0.2, and 1 µm. Then, the nitride-based semiconductor laser bar 13 is fixed to the heat sink 73 by placing the nitride-based semiconductor laser bar 13 on the brazing material 14, and heating, melting, and then solidifying the brazing material 14 while pressing the nitride-based semiconductor laser bar 13 toward the heat sink 73 with a bonding collet 71, which has a curvature approximately equivalent to the curvature of the cylindrical surface 73a of the heat sink.

In the laser element produced as above, the light-emission points are aligned along an arc having a curvature approximately equivalent to the curvature of the cylindrical surface 73a of the heat sink, as illustrated in FIG. 8B. In this example, the light-emission-point displacement is 0.4 micrometers.

Since the nitride-based semiconductor laser bar 13 and the heat sink 73 are bonded together with the AuSn brazing material, the nitride-based semiconductor laser bar 13 and the heat sink 73 are firmly fixed, and the reliability over time is high.

Figure 9:
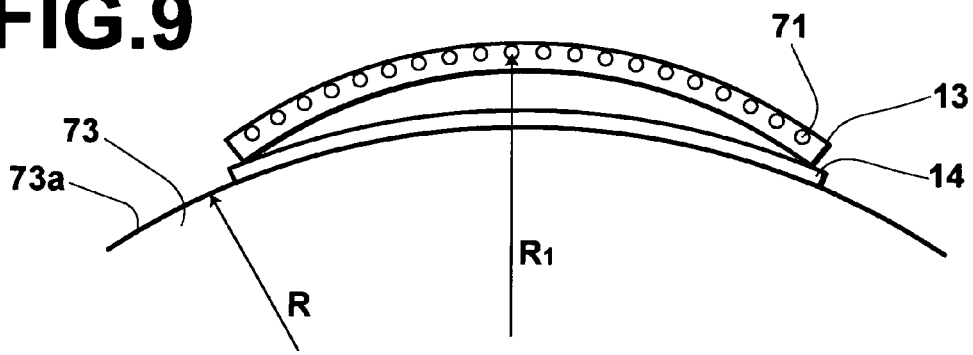
FIG. 9 is a diagram indicating a definition of the light-emission-point displacement in the case where the fixation surface of a heat sink is arched.

As illustrated in FIG. 9, when the surface of the heat sink is arched, the light-emission-point displacement is defined as a difference ($R_1$-R) between the radius $R_1$ of curvature of the arc along which the light-emission points are aligned and the radius R of curvature of the fixation surface of the heat sink.

Figure 10:
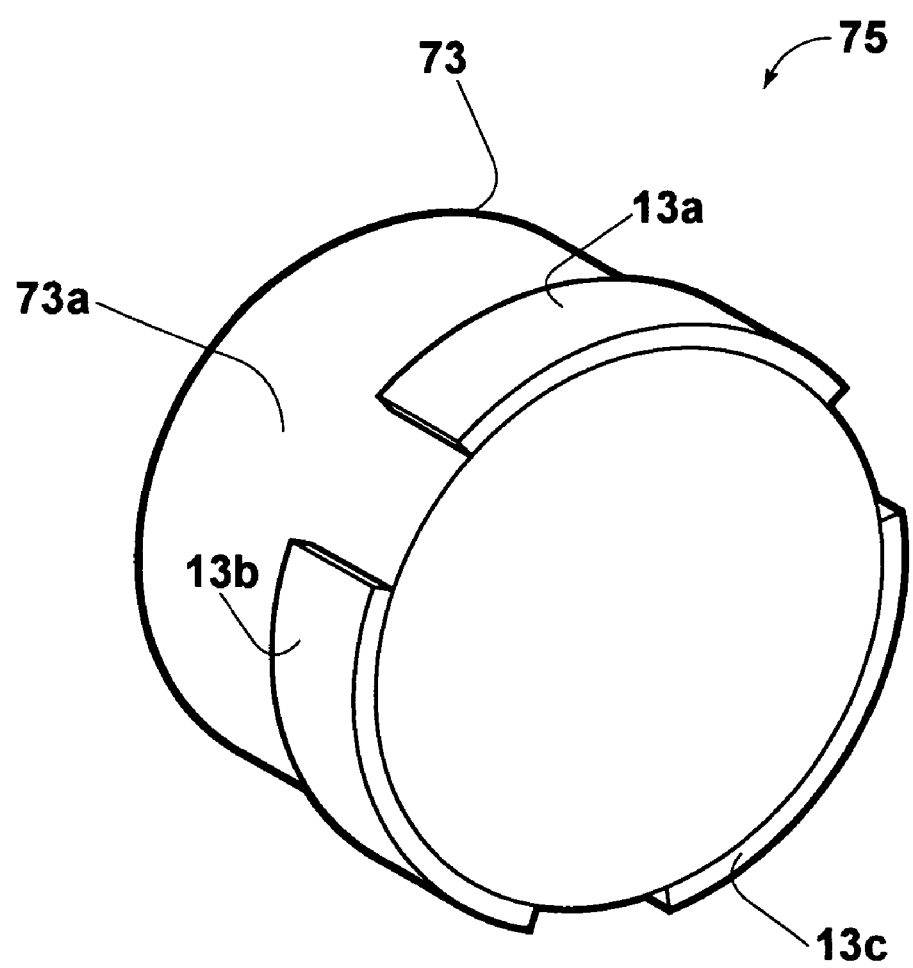
FIG. 10 is a perspective view of an example of the laser element according to the third embodiment.

FIG. 10 is a perspective view of an example of the laser element according to the third embodiment produced as above. In the laser element 75 illustrated in FIG. 10, three nitride-based semiconductor laser bars 13a, 13b, and 13c are bonded with the AuSn brazing material to the cylindrical surface 73a of the heat sink 73 so as to be equally spaced, where the radius of the heat sink 73 is 7 mm, and each of the three nitride-based semiconductor laser bars 13a, 13b, and 13c is produced in a similar manner to the nitride-based semiconductor laser bar 13 in the construction of FIG. 8A, and has twenty light-emission points.

Fourth Embodiment

A laser module according to the fourth embodiment of the present invention, which uses the laser element 75 according to the third embodiment of the present invention is explained below. FIG. 11 is a perspective view of the laser module according to the fourth embodiment.

As illustrated in FIG. 11, the laser module according to the fourth embodiment comprises the laser element 75, an optical system, and a single multimode optical fiber 83. The optical system is constituted by three collimator-lens arrays 81a, 81b, and 81c and a condensing lens 82.

Although each of the nitride-based semiconductor laser bars 13a, 13b, and 13c emits twenty laser beams, in order to simplify the illustration, only two of the twenty laser beams emitted from each of the nitride-based semiconductor laser bars 13a, 13b, and 13c are illustrated in FIG. 11.

The collimator-lens arrays 81a, 81b, and 81c are arranged in correspondence with the nitride-based semiconductor laser bars 13a, 13b, and 13c, respectively, and twenty divergent laser beams emitted from the twenty light-emission points in each of the nitride-based semiconductor laser bars 13a, 13b, and 13c are collimated by the corresponding one of the collimator-lens arrays 81a, 81b, and 81c.

The collimated laser beams are collected by the condensing lens 82, and converge on an entrance-end face of the core of the multimode optical fiber 83. Thus, the laser beams collimated and collected as above enter and propagate through the core of the multimode optical fiber 83, and are optically multiplexed into a single laser beam B, which is then outputted from the multimode optical fiber 83.

The condensing lens 82 can be formed, for example, by molding from resin or optical glass.

In the laser element 75 used in the laser module according to the fourth embodiment of the present invention, the light-emission points are substantially aligned along a circle having a radius which is almost equal to the radius of curvature of the surface of the heat sink 73, and the nitride-based semiconductor laser bars 13a, 13b, and 13c are firmly bonded to the heat sink 73. That is, the laser module according to the fourth embodiment uses a laser element having high reliability over time. Therefore, it is sufficient to align the optical axes of the collimator lenses along the circle corresponding to the surface of the heat sink. Thus, according to the fourth embodiment of the present invention, designing and alignment of the optical system and manufacture of the laser module are easy.

In addition, all of the contents of the Japanese patent application No. 2003-024001 are incorporated into this specification by reference.

What is claimed is:

1. A laser element comprising:
   a heat sink which is comprised of one of copper and copper alloy, and which comprises a fixation surface having a predetermined shape; and
   a nitride-based semiconductor laser bar which comprises a top surface and at least three light-emission points formed on a substrate,
   wherein the nitride-based semiconductor laser bar is bonded to said heat sink with a brazing material comprising gold and one of tin and silicon as main components, by pressing the whole top surface of the nitride-based semiconductor laser bar toward said fixation surface with a tool having a shape corresponding to the predetermined shape of the fixation surfaces, during a brazing operation.

2. A laser module comprising:
   an optical fiber;
   a laser element which comprises:
      a heat sink which is comprised of one of copper and copper alloy, and which comprises a fixation surface having a predetermined shape; and
      a nitride-based semiconductor laser bar which comprises a top surface and at least three light-emission points formed on a substrate, wherein the nitride-based semiconductor laser bar emits laser beams from the at least three light-emission points, and is bonded to said heat sink with a brazing material comprising gold and one of tin and silicon as main components, by pressing the whole top surface of the nitride-based semiconductor laser bar toward said fixation surface with a tool having a shape corresponding to the predetermined shape of the fixation surfaces, during a brazing operation; and
   an optical condensing system which optically multiplexes said laser beams, and directs the optically multiplexed laser beams into said optical fiber.

3. The laser element according to claim 1, wherein the fixation surface has a predetermined area; and
 wherein the tool has an area corresponding to the predetermined area of the fixation surface.

4. The laser element according to claim 1, wherein the nitride-based semiconductor laser bar is bonded to said heat sink with the brazing material, by pressing the nitride-based semiconductor laser bar, with the tool, on substantially an entire area of a surface of the nitride-based semiconductor laser bar, during the brazing operation.

5. The laser element according to claim 1, wherein a length of the tool is approximately equal to a longitudinal size of the nitride-based semiconductor laser bar.

6. The laser element according to claim 1, wherein the nitride-based semiconductor laser bar comprises a plurality of semiconductor layers formed on the substrate so as to realize the at least three light-emission points.

* * * * *